(12) United States Patent
Sammakia et al.

(10) Patent No.: US 8,518,304 B1
(45) Date of Patent: Aug. 27, 2013

(54) NANO-STRUCTURE ENHANCEMENTS FOR ANISOTROPIC CONDUCTIVE MATERIAL AND THERMAL INTERPOSERS

(75) Inventors: Bahgat Sammakia, Binghamton, NY (US); Wayne E. Jones, Jr., Vestal, NY (US); Ganesh Subbarayan, West Lafayette, IN (US)

(73) Assignee: The Research Foundation of State University of New York, Binghamton, NY (US)

( * ) Notice: Subject to any disclaimer, the term of this patent is extended or adjusted under 35 U.S.C. 154(b) by 770 days.

(21) Appl. No.: 12/686,236

(22) Filed: Jan. 12, 2010

Related U.S. Application Data

(63) Continuation-in-part of application No. 10/402,293, filed on Mar. 31, 2003, now Pat. No. 7,645,512.

(51) Int. Cl.
  *H01B 1/00* (2006.01)
  *H01B 1/04* (2006.01)
  *H01B 1/02* (2006.01)
  *H05K 1/09* (2006.01)

(52) U.S. Cl.
  USPC ............ 252/500; 252/502; 252/512; 174/257

(58) Field of Classification Search
  USPC ............................... 252/500–521.6; 174/257
  See application file for complete search history.

(56) References Cited

U.S. PATENT DOCUMENTS

| | | | |
|---|---|---|---|
| 4,632,798 A | 12/1986 | Eickman et al. | |
| 4,720,424 A | 1/1988 | Eickman et al. | |
| 4,731,282 A | 3/1988 | Tsukagoshi et al. | |
| 4,740,657 A | 4/1988 | Tsukagoshi et al. | |
| 4,778,950 A | 10/1988 | Lee et al. | |
| 4,958,050 A | 9/1990 | Oku et al. | |
| 4,972,580 A | 11/1990 | Nakamura | |
| 4,985,663 A | 1/1991 | Nakatani | |
| 4,999,460 A | 3/1991 | Sugiyama et al. | |
| 5,001,302 A | 3/1991 | Atsumi | |
| 5,087,494 A | 2/1992 | Calhoun et al. | |
| 5,093,985 A | 3/1992 | Houldsworth et al. | |
| 5,123,986 A | 6/1992 | Sugiyama et al. | |
| 5,130,833 A | 7/1992 | Mase | |
| 5,136,365 A | 8/1992 | Pennisi et al. | |
| 5,147,210 A | 9/1992 | Patterson et al. | |
| 5,155,301 A | 10/1992 | Mase | |
| 5,162,613 A | 11/1992 | Schoenthaler | |
| 5,178,691 A | 1/1993 | Yamashita et al. | |
| 5,180,888 A | 1/1993 | Sugiyama et al. | |
| 5,206,585 A | 4/1993 | Chang et al. | |
| 5,225,966 A | 7/1993 | Basavanhally et al. | |
| 5,235,741 A | 8/1993 | Mase | |
| 5,304,460 A | 4/1994 | Fulton et al. | |

(Continued)

*Primary Examiner* — Mark Kopec
*Assistant Examiner* — Jaison Thomas
(74) *Attorney, Agent, or Firm* — Steven M. Hoffberg; Ostrolenk Faber LLP

(57) ABSTRACT

The present invention features additions of nanostructures to interconnect conductor particles to: (1) reduce thermal interface resistance by using thermal interposers that have high thermal conductivity nanostructures at their surfaces; (2) improve the anisotropic conductive adhesive interconnection conductivity with microcircuit contact pads; and (3) allow lower compression forces to be applied during the microcircuit fabrication processes which then results in reduced deflection or circuit damage. When pressure is applied during fabrication to spread and compress anisotropic conductive adhesive and the matrix of interconnect particles and circuit conductors, the nano-structures mesh and compress into a more uniform connection than current technology provides, thereby eliminating voids, moisture and other contaminants, increasing the contact surfaces for better electrical and thermal conduction.

20 Claims, 6 Drawing Sheets

(56) References Cited

U.S. PATENT DOCUMENTS

| | | |
|---|---|---|
| 5,330,684 A | 7/1994 | Emori et al. |
| 5,334,330 A | 8/1994 | Rowlette |
| 5,336,443 A | 8/1994 | Odashima |
| 5,357,084 A | 10/1994 | McKee et al. |
| 5,360,943 A | 11/1994 | Mori et al. |
| 5,369,219 A | 11/1994 | Kerns |
| 5,401,587 A | 3/1995 | Motohiro et al. |
| 5,409,520 A | 4/1995 | Mori et al. |
| 5,428,190 A | 6/1995 | Stopperan |
| 5,438,165 A | 8/1995 | Fritz |
| 5,445,308 A | 8/1995 | Nelson et al. |
| 5,463,190 A | 10/1995 | Carson et al. |
| 5,500,489 A | 3/1996 | Shah et al. |
| 5,531,942 A | 7/1996 | Gilleo et al. |
| 5,543,583 A | 8/1996 | Carson et al. |
| 5,565,261 A | 10/1996 | Carson et al. |
| 5,571,612 A | 11/1996 | Motohiro et al. |
| 5,578,325 A | 11/1996 | Domb et al. |
| 5,585,037 A | 12/1996 | Linton |
| 5,589,255 A | 12/1996 | Enomoto et al. |
| 5,613,862 A | 3/1997 | Naylor |
| 5,620,795 A | 4/1997 | Haak et al. |
| 5,621,836 A | 4/1997 | Schofield et al. |
| 5,631,447 A | 5/1997 | Smith et al. |
| 5,636,996 A | 6/1997 | Johnson et al. |
| 5,637,176 A | 6/1997 | Gilleo et al. |
| 5,650,787 A | 7/1997 | Lim et al. |
| 5,650,919 A | 7/1997 | Loh et al. |
| 5,661,042 A | 8/1997 | Fang et al. |
| 5,678,287 A | 10/1997 | Smith et al. |
| 5,678,545 A | 10/1997 | Stratbucker |
| 5,685,939 A | 11/1997 | Wolk et al. |
| 5,686,703 A | 11/1997 | Yamaguchi |
| 5,710,612 A | 1/1998 | Mase |
| 5,711,063 A | 1/1998 | Budde et al. |
| 5,731,636 A | 3/1998 | Chun |
| 5,741,430 A | 4/1998 | Dahringer et al. |
| 5,741,435 A | 4/1998 | Beetz, Jr. et al. |
| 5,749,997 A | 5/1998 | Tang et al. |
| 5,769,996 A | 6/1998 | McArdle et al. |
| 5,819,406 A | 10/1998 | Yoshizawa et al. |
| 5,837,119 A | 11/1998 | Kang et al. |
| 5,840,215 A | 11/1998 | Iyer et al. |
| 5,842,273 A | 12/1998 | Schar |
| 5,851,644 A | 12/1998 | McArdle et al. |
| 5,859,385 A | 1/1999 | Nicolai |
| 5,861,661 A | 1/1999 | Tang et al. |
| 5,879,570 A | 3/1999 | Hagen |
| 5,890,915 A | 4/1999 | Reylek |
| 5,891,366 A | 4/1999 | Gruenwald et al. |
| 5,896,246 A | 4/1999 | Budde et al. |
| 5,902,438 A | 5/1999 | Arthur et al. |
| 5,906,742 A | 5/1999 | Wang et al. |
| 5,916,641 A | 6/1999 | McArdle et al. |
| 5,923,080 A | 7/1999 | Chun |
| 5,932,339 A | 8/1999 | Sakurai et al. |
| 5,989,406 A | 11/1999 | Beetz, Jr. et al. |
| 6,008,072 A | 12/1999 | Tang |
| 6,011,307 A | 1/2000 | Jiang et al. |
| 6,020,059 A | 2/2000 | Yamada et al. |
| 6,036,813 A | 3/2000 | Schulz et al. |
| 6,103,359 A | 8/2000 | Doi |
| 6,108,172 A | 8/2000 | Hagen |
| 6,110,399 A | 8/2000 | McArdle et al. |
| 6,118,665 A | 9/2000 | Kishida et al. |
| 6,126,865 A | 10/2000 | Haak et al. |
| 6,147,870 A | 11/2000 | Pommer |
| 6,149,857 A | 11/2000 | McArdle et al. |
| 6,168,442 B1 | 1/2001 | Naoi |
| 6,180,226 B1 | 1/2001 | McArdle et al. |
| 6,190,578 B1 | 2/2001 | Yokoyama et al. |
| 6,194,492 B1 | 2/2001 | Sakurai et al. |
| 6,194,780 B1 | 2/2001 | Tang |
| 6,214,460 B1 | 4/2001 | Bluem et al. |
| 6,218,446 B1 | 4/2001 | Arnold et al. |
| 6,223,429 B1 | 5/2001 | Kaneda et al. |
| 6,238,597 B1 | 5/2001 | Yim et al. |
| 6,243,946 B1 | 6/2001 | Suzuki et al. |
| 6,284,086 B1 | 9/2001 | Cardellino et al. |
| 6,323,432 B1 | 11/2001 | Campbell et al. |
| 6,344,156 B1 | 2/2002 | Yamada et al. |
| 6,352,775 B1 | 3/2002 | Sasaki et al. |
| 6,355,504 B1 | 3/2002 | Jiang |
| 6,376,050 B1 | 4/2002 | Terasaki et al. |
| 6,376,393 B1 | 4/2002 | Newton et al. |
| 6,388,321 B1 | 5/2002 | Hirai et al. |
| 6,392,306 B1 | 5/2002 | Khandros et al. |
| 6,402,876 B1 | 6/2002 | McArdle et al. |
| 6,404,476 B1 | 6/2002 | Mase |
| 6,406,140 B1 | 6/2002 | Wotton et al. |
| 6,453,553 B1 | 9/2002 | Caillat et al. |
| 6,458,624 B1 | 10/2002 | Jiang et al. |
| 6,468,830 B1 | 10/2002 | Carson |
| 6,506,978 B1 | 1/2003 | Furihata |
| 6,518,097 B1 | 2/2003 | Yim et al. |
| 6,579,744 B1 | 6/2003 | Jiang |
| 6,618,941 B2 | 9/2003 | Campbell et al. |
| 6,680,517 B2 | 1/2004 | Namba |
| 6,696,744 B2 | 2/2004 | Feygenson et al. |
| 6,703,566 B1 | 3/2004 | Shiraishi et al. |
| 6,727,313 B2 | 4/2004 | Zhou et al. |
| 6,733,613 B2 | 5/2004 | Khanna |
| 6,755,886 B2 | 6/2004 | Phillips et al. |
| 6,760,969 B2 | 7/2004 | Kumakura |
| 6,770,369 B1 | 8/2004 | Oyamada et al. |
| 6,777,071 B2 | 8/2004 | Cobbley et al. |
| 6,791,169 B2 | 9/2004 | Carson |
| 6,812,065 B1 | 11/2004 | Kitamura |
| 6,825,552 B2 | 11/2004 | Light et al. |
| 6,825,570 B2 | 11/2004 | Jiang et al. |
| 6,833,166 B2 | 12/2004 | Hikmet |
| 6,838,022 B2 | 1/2005 | Khanna |
| 6,849,335 B2 | 2/2005 | Igarashi et al. |
| 6,858,973 B2 | 2/2005 | Nugues et al. |
| 6,870,385 B2 | 3/2005 | Inoue et al. |
| 6,878,435 B2 | 4/2005 | Paik et al. |
| 6,884,833 B2 | 4/2005 | Chheang et al. |
| 6,906,427 B2 | 6/2005 | Tanaka et al. |
| 6,916,994 B2 | 7/2005 | Glovatsky |
| 6,923,882 B2 | 8/2005 | Iwamoto et al. |
| 6,939,431 B2 | 9/2005 | Mizuta et al. |
| 6,951,684 B2 | 10/2005 | Cobbley et al. |
| 6,956,635 B2 | 10/2005 | Mase |
| 6,977,025 B2 | 12/2005 | McArdle et al. |
| 6,981,317 B1 | 1/2006 | Nishida |
| 7,026,239 B2 | 4/2006 | Souriau et al. |
| 7,036,573 B2 | 5/2006 | Koning et al. |
| 7,038,327 B2 | 5/2006 | Ho et al. |
| 7,049,836 B2 | 5/2006 | Setaka |
| 7,071,722 B2 | 7/2006 | Yamada et al. |
| 7,078,078 B2 | 7/2006 | Ito |
| 7,078,095 B2 | 7/2006 | Tam |
| 7,081,675 B2 | 7/2006 | Yim et al. |
| 7,088,005 B2 | 8/2006 | Lee |
| 7,095,241 B2 | 8/2006 | Setaka et al. |
| 7,097,471 B2 | 8/2006 | Narui |
| 7,131,851 B2 | 11/2006 | Setaka et al. |
| 7,140,101 B2 | 11/2006 | Cheng et al. |
| 7,156,669 B2 | 1/2007 | Asai et al. |
| 7,160,123 B2 | 1/2007 | Yamada et al. |
| 7,166,161 B2 | 1/2007 | Lazarev et al. |
| 7,169,332 B2 | 1/2007 | Oh et al. |
| 7,190,180 B2 | 3/2007 | Yamada et al. |
| 7,213,908 B2 | 5/2007 | Chwalek et al. |
| 7,226,660 B2 | 6/2007 | Kuroda et al. |
| 7,244,127 B2 | 7/2007 | Hasegawa |
| 7,255,579 B2 | 8/2007 | Sato et al. |
| 7,256,345 B2 | 8/2007 | Inoue |
| 7,265,563 B2 | 9/2007 | Cram |
| 7,267,559 B2 | 9/2007 | Hashitani et al. |
| 7,291,393 B2 | 11/2007 | Wakiya et al. |
| 7,291,925 B2 | 11/2007 | Han et al. |
| 7,294,358 B2 | 11/2007 | Tam |
| 7,304,390 B2 | 12/2007 | Hasegawa |

| | | |
|---|---|---|
| 7,309,244 B2 | 12/2007 | Yamada et al. |
| 7,311,531 B2 | 12/2007 | Igarashi et al. |
| 7,326,316 B2 | 2/2008 | Cobbley et al. |
| 7,328,508 B2 | 2/2008 | Edwards et al. |
| 7,331,106 B2 | 2/2008 | Workman et al. |
| 7,355,122 B2 | 4/2008 | Moore |
| 7,357,883 B2 | 4/2008 | Ninomiya et al. |
| 7,362,087 B2 | 4/2008 | Kimura et al. |
| 7,382,017 B2 | 6/2008 | Duan et al. |
| 7,384,279 B2 | 6/2008 | Igarashi et al. |
| 7,384,280 B2 | 6/2008 | Yamada et al. |
| 7,390,540 B2 | 6/2008 | Beck et al. |
| 7,393,471 B2 | 7/2008 | Inoue et al. |
| 7,408,263 B2 | 8/2008 | Meth |
| 7,438,834 B2 | 10/2008 | Jang et al. |
| 7,438,953 B2 | 10/2008 | Kotov et al. |
| 7,452,923 B2 | 11/2008 | Jeon et al. |
| 7,464,462 B2 | 12/2008 | Edwards et al. |
| 7,465,491 B2 | 12/2008 | Hasegawa et al. |
| 7,469,941 B2 | 12/2008 | Aoki et al. |
| 7,470,416 B2 | 12/2008 | Ishida |
| 7,481,267 B2 | 1/2009 | Zhan et al. |
| 7,494,704 B2 | 2/2009 | Massa et al. |
| 7,507,449 B2 | 3/2009 | Chari et al. |
| 7,507,477 B2 | 3/2009 | Kubota |
| 7,507,777 B2 | 3/2009 | Todoroki et al. |
| 7,510,962 B2 | 3/2009 | Brun et al. |
| 7,515,238 B2 | 4/2009 | Chen et al. |
| 7,537,459 B2 | 5/2009 | Takegahara et al. |
| 7,563,487 B2 | 7/2009 | Masuda et al. |
| 7,566,494 B2 | 7/2009 | Jun et al. |
| 7,595,528 B2 | 9/2009 | Duan et al. |
| 7,615,476 B2 | 11/2009 | Hua |
| 7,618,266 B2 | 11/2009 | Yamada et al. |
| 7,645,512 B1 | 1/2010 | Sammakia et al. |
| 7,667,480 B2 | 2/2010 | Okuda et al. |
| 7,675,601 B2 | 3/2010 | Kang et al. |
| 7,690,932 B2 | 4/2010 | Nakaone |
| 7,691,475 B2 | 4/2010 | Larson et al. |
| 7,700,007 B2 | 4/2010 | Jung et al. |
| 7,727,423 B2 | 6/2010 | Yoon et al. |
| 7,785,494 B2 | 8/2010 | Yeh |
| 7,815,999 B2 | 10/2010 | Park et al. |
| 7,816,780 B2 | 10/2010 | Kajiwara et al. |
| 7,829,190 B2 | 11/2010 | Cobbley et al. |
| 7,850,760 B2 | 12/2010 | Kuwabara et al. |
| 7,851,063 B2 | 12/2010 | Jun et al. |
| 7,875,807 B2 | 1/2011 | Sano et al. |
| 7,887,899 B2 | 2/2011 | Fujita et al. |
| 7,888,604 B2 | 2/2011 | Kawate et al. |
| 7,910,181 B2 | 3/2011 | Beck et al. |
| 7,922,497 B2 | 4/2011 | Yamada et al. |
| 7,923,488 B2 | 4/2011 | Xu et al. |
| 7,931,956 B2 | 4/2011 | Fujita |
| 7,947,199 B2 | 5/2011 | Wessling |
| 7,998,305 B2 | 8/2011 | Cobbley et al. |
| 8,003,017 B2 | 8/2011 | Jeon et al. |
| 8,008,582 B2 | 8/2011 | Shimada |
| 8,016,181 B2 | 9/2011 | Saimen |
| 8,034,261 B2 | 10/2011 | Kim et al. |
| 8,038,762 B2 | 10/2011 | Kuwabara et al. |
| 8,089,151 B2 | 1/2012 | Jun et al. |
| 8,129,023 B2 | 3/2012 | Jun et al. |
| 8,138,614 B2 | 3/2012 | Yamazaki et al. |
| 8,163,835 B2 | 4/2012 | Park et al. |
| 8,173,260 B1 | 5/2012 | Sammakia et al. |
| 8,178,201 B2 | 5/2012 | Lee et al. |
| 8,187,912 B2 | 5/2012 | Lucas et al. |
| 8,229,175 B2 | 7/2012 | Tang |
| 8,241,750 B2 | 8/2012 | Liu |
| 8,247,701 B2 | 8/2012 | Usui et al. |
| 2002/0149005 A1 | 10/2002 | Khattar et al. |
| 2003/0218258 A1 | 11/2003 | Charles et al. |
| 2009/0035553 A1* | 2/2009 | Yeh .............................. 428/323 |

\* cited by examiner

NANO-STRUCTURE ENHANCEMENTS FOR ANISOTROPIC CONDUCTIVE MATERIAL AND THERMAL INTERPOSERS

CROSS REFERENCE TO RELATED APPLICATION

This application is a Continuation-in-Part of U.S. Ser. No. 10/402,293, filed Mar. 31, 2003, the entirety of which is expressly incorporated herein by reference.

BACKGROUND OF THE INVENTION

1. Field of the Invention

The invention pertains to electrical circuit interconnections and, more particularly, to the addition of nano-structures that facilitate thermal dissipation and electrical conductivity in microcircuits that are fabricated using conductive materials and anisotropic conductive adhesives.

2. Discussion of the Related Art

Clearly, the continuing development of microcircuits includes, among others, the objectives of: application of flexible printed circuits, increased capacity (more switching functions in smaller devices), and a host of robustness issues, such as moisture control, improved shock-resistance, and use in higher temperature applications. These issues become more crucial when printed circuits are used in environments in which they are shocked or vibrated, as in machinery or fighter planes, or when high temperature, moisture, or contamination is experienced, as in industrial corrosive and high-humidity environments and in the engine compartment vehicle. To achieve these objectives, improvements in the connections between microcircuit components and the circuit chip or printed circuit board must be made.

Conductive adhesives and anisotropic conductive adhesives (ACA) have been used regularly in microcircuit fabrication, and their composition has been well described. Isotropic conductive adhesives (ICA) (or merely "conductive adhesives") provide uniform conductivity along all axes, and thus do not isolate adjacent conductors which are each embedded in the matrix. The distance across a gap between conductors intended to be electrically connected, and the distance between adjacent conductors intended to be electrically isolated may be of similar scale. Thus, insulating barriers are required for isolation, making bulk dispensing problematic.

These isotropic adhesive compositions consist primarily of an insulating adhesive resin carrier in which a matrix of interconnect fine particles is suspended. For the purpose of this description, such fine particles and the device and circuit board connections, including metal, metalized polymer, carbon or carbonaceous, micron or sub-micron sized shapes, including spheres, rods, tubes, conductors for heat transfer or electrical connection, printed circuit substrates and lands, and/or other regular and irregularly shaped particles and connectors, upon which nano-structures are attached or grown, are referred to as spheres. The spheres in the adhesive compositions, when squeezed under pressure during microcircuit fabrication, interconnect the components and layers of the microcircuit chip or circuit board. It is to be particularly emphasized that the nano-structures may be grown on flat surfaces of the conductor pads, the active device (chip), printed circuit substrates and connectors and are not limited to the surface of particles in dispersion within an adhesive matrix. In other words, any body on whose surface these nano-structures are grown is referred to as a sphere, regardless of its shape.

For the purpose of description, the nano-structures are drawn as columns in the figures, but they may be spikes, cylinders, tubes, hemispheres, fibers, or any other regular or irregular shape; they are referred to as nano-structures.

The adhesive compositions have several purposes including, but not limited to: providing the carrier medium for the matrix of interconnect spheres to be distributed between the microcircuit devices and conductor pads; providing the thermal path for heat that is generated by the switching functions; the cured adhesive supports and electrically insulates between interconnection particles and conductors on the microcircuits, and it prevents moisture or other contaminants from getting into or being entrapped within the interconnections.

Several problems arise from the use of isotropic conductive adhesives and anisotropic conductive adhesive that affect the capacity of the microcircuit, specifically, thermal dissipation and electrical interconnection. Those effects, in turn, can limit the number of circuit switches on, or logic operations performed by, a microcircuit. One of these problems is a need to apply high pressure to the microcircuit during fabrication that can damage or misalign parts of the circuit. Also, entrapped air in voids has lower thermal conductivity and can limit heat dissipation from the microcircuit. Third, increased resistance in the interconnect can result from insufficient interconnect particle to contact surface connection.

It would be advantageous to provide isotropic conductive adhesives and anisotropic conductive adhesive interconnects in which thermal and electrical interconnection resistance and distortion or damage of circuit boards are reduced or eliminated. With existing interconnects, regardless of specific metal or metallized polymer or carbonaceous material used for interconnects, or whether their surfaces are smooth or irregular, the thermal and electrical conductivity and board distortion or damage problems described above exist to varying degrees.

SUMMARY OF THE INVENTION

The present invention provides a matrix, such as an electrically insulating adhesive or stable non-adhesive material, which may be a polymer, grease, gel, or the like, filled with conductive interconnect particles, the particles (and optionally adjacent surfaces) having nano-structures, adapted to: reduce thermal interface resistance; improve the conductivity between with microcircuit contact pads joined by the matrix; and, allow lower compression forces to be applied during the microcircuit fabrication processes which then results in reduced deflection or circuit damage.

Accordingly, the present invention provides an innovative improvement in conductive compositions and anisotropic conductive composition interconnection technology by growing or attaching nano-structures to the interconnect particles and optionally the microcircuit connection pads, adapted to address one or more of the problems listed above. When pressure is applied during fabrication to spread and compress conductive matrix of interconnect particles and circuit conductors, the nano-structures mesh and compress along the compression axis into a more uniform connection than current technology provides, thereby eliminating voids, moisture, and other contaminants, increasing the contact surfaces for better electrical and thermal conduction.

The matrix may be curable or stable, and is preferably electrically insulating. The matrix preferably has a high thermal conductivity, which may be an isotropic phenomena, but is preferably not loaded with non-conductive particles in addition to the conductive ones, and more preferably is loaded only with particles having nanostructures formed thereon.

The loading ratio of particles in an anisotropic conductive matrix is preferably such that, after compressing and curing (for a curable matrix), the particles form a continuous electrically conductive path between two electrical connection pads spaced by the matrix, while electrical connection pads offset with respect to the compression axis are electrically isolated relative to the electrical connection pads directly in line with the compression axis, and the isolation is greater than reflected solely by the distance between the respective electrical connection pads that would be implied by the distance and geometry alone.

The particles may be shaped as platelets, ovoids or disks, which naturally tend to align with respect to a compression axis, with relatively large expanses of parallel surface between adjacent particles.

It is therefore an object to provide an anisotropic conductive composition, comprising: an electrically insulating carrier composition, which prior to any curing preferably has a high viscosity; a plurality of electrically and thermally conductive interconnect particles suspended in the electrically insulating carrier composition, each having an outer surface; and a plurality of electrically conducting elongated nanostructures affixed to and selectively extending away from the outer surface along the elongated axis, wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition, and wherein the conducting elongated nanostructures on a respective conductive interconnect particle are adapted to engage and interlock with the conducting elongated nanostructures on another respective conductive interconnect particle when mutually compressed, to form an efficient thermal and electrical conduction path.

It is another object to provide a method of forming an anisotropic conductive path, comprising: providing an anisotropic conductive composition, comprising a plurality of electrically and thermally conductive interconnect particles suspended in an electrically insulating carrier composition, each having an outer surface, with a plurality of electrically conducting elongated nanostructures affixed to and selectively extending away from the outer surface along the elongated axis, wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition; and dispensing the anisotropic conductive composition between at least adjacent two pairs of opposed contact surfaces; and compressing the anisotropic conductive composition to selectively form electrical conduction paths across the opposed contact surfaces maintaining electrical isolation between non-opposed contact surfaces, wherein the conducting elongated nanostructures on a respective conductive interconnect particle are adapted to engage and interlock with the conducting elongated nanostructures on another respective conductive interconnect particle when mutually compressed, to form an efficient thermal and electrical conduction path.

It is a still further object of provide a module, comprising: at least adjacent two pairs of opposed contact surfaces, having an intracontact gap between the contact surfaces of a respective pair and an intercontact gap between respective pairs; a continuous portion of an anisotropic conductive composition provided in the intracontact gap and the intercontact gap, comprising a plurality of electrically and thermally conductive interconnect particles suspended in an electrically insulating carrier composition, each having an outer surface, with a plurality of electrically conducting elongated nanostructures affixed to and selectively extending away from the outer surface along the elongated axis, wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition; a selectively formed electrically conductive path across the intracontact gaps comprising commonly occurring engaged and interlocked conducting elongated nanostructures, and a selectively formed electrically isolating space in the intercontact gap in which engaged and rarely occurring interlocked conducting elongated nanostructures bridging the intercontact gap.

The insulating carrier composition may comprise an adhesive polymer resin or a thermal grease.

The conductive interconnect particles may have a metallic shell comprising the conducting elongated nanostructures. The conductive interconnect particles may have a polymeric or carbonaceous core.

The conductive interconnect particles may be, for example, spherical, ovoid, disk-like or tubular, for example.

The nanostructures may be are selected from the group consisting of one or more of columns, spikes, cylinders, tubes and fibers.

At least two pairs of opposed contact surfaces may be immersed in said anisotropic composition, wherein after compression, an electrical current selectively flows through the anisotropic conductive composition between opposed contact surfaces and does not selectively flow between non-opposed contact surfaces. At least one contact surface may be coated with a plurality of electrically conducting elongated nanostructures affixed to and selectively extending away from the contact surface along the elongated axis, wherein the conducting elongated nanostructures on the contact surface are adapted to engage and interlock with the conducting elongated nanostructures on an adjacent conductive interconnect particle when mutually compressed, to form an efficient thermal and electrical conduction path.

BRIEF DESCRIPTIONS OF THE DRAWINGS

A complete understanding of the present invention may be obtained by reference to the accompanying drawings, when considered in conjunction with the subsequent detailed description, in which:

FIGS. 1a, 1b, and 1c, taken together, show a schematic diagram depicting, in general, the prior art process of anisotropic conductive adhesive with a matrix of interconnect spheres electrically and thermally connecting contacts and conductors of a microcircuit or circuit board;

Figure 5:
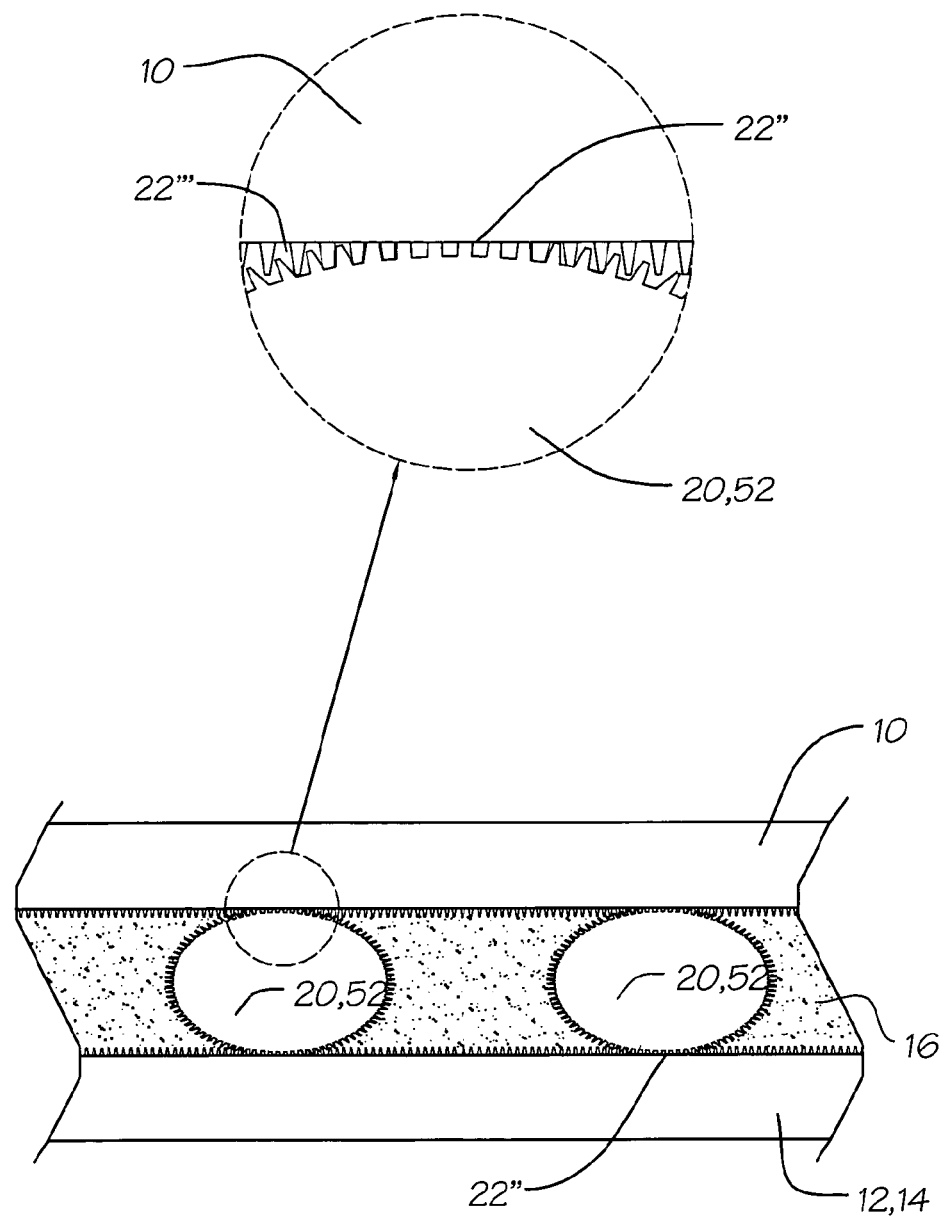
Figure 6A:
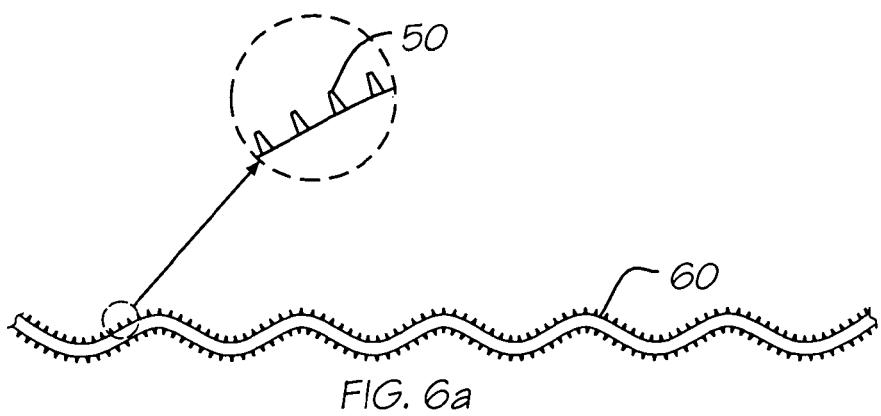
Figure 6B:
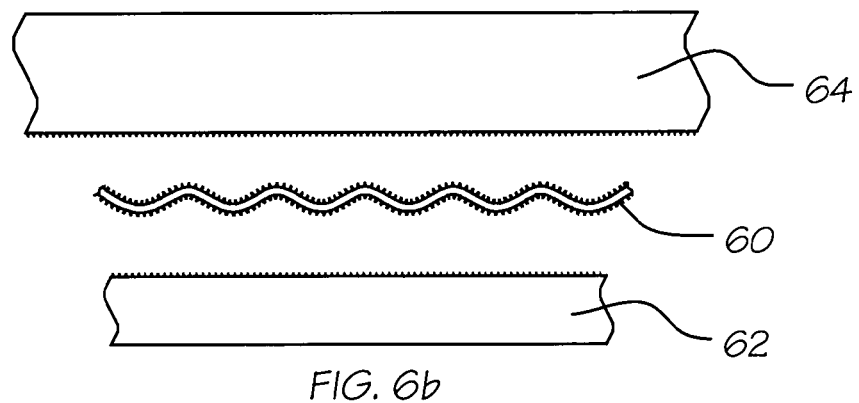
Figure 6C:
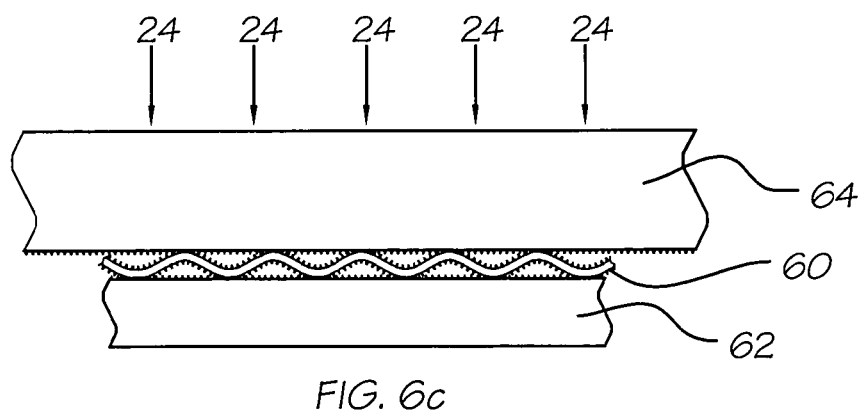

FIGS. 4a, 4b, 4c and 4d, taken together, show a schematic diagram depicting, in general, the nano-structures of the present invention attached to or grown from an interconnect sphere and a thermally conductive tube;

FIG. 5 is a schematic diagram depicting an assembly of a chip to a heat sink using a thermal plane as an interface with nano-structures attached; and FIGS. 6a, 6b, and 6c, taken together, show a schematic diagram depicting the nano-structures meshing and compressing into a more uniform connection than current technology provides, thereby eliminating voids, moisture, and other contaminants, increasing the contact surfaces for better electrical and thermal conduction.

Figure 6D:
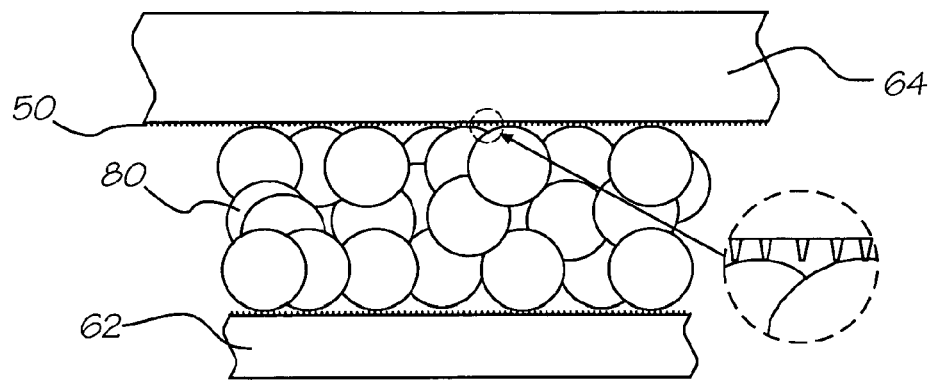
Figure 6E:
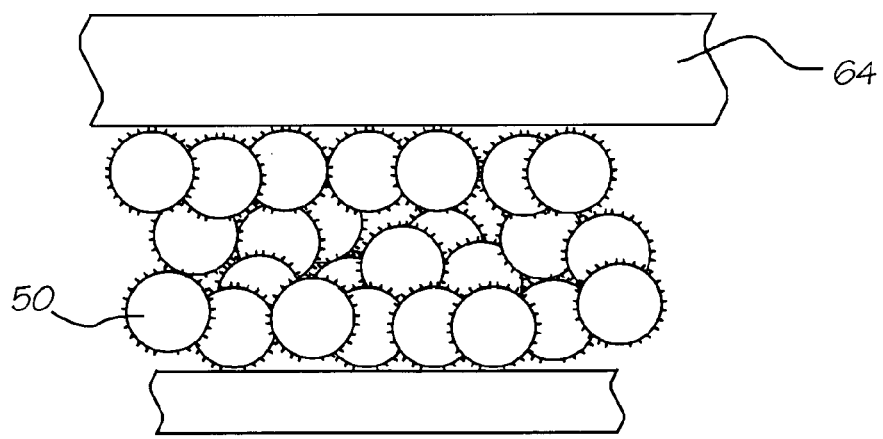

FIGS. 6d and 6e, taken together, show a schematic diagram depicting the nano-structures grown on filler material particles and heat sink to improve their contact within the anisotropic adhesive system.

DETAILED DESCRIPTION OF THE PREFERRED EMBODIMENT

Generally speaking, the invention pertains to electrical circuit interconnections. More specifically, the invention features the addition of nano-structures on the surfaces of conductive particles in an insulating interface matrix, and optionally on the surfaces being interconnected, that facilitate thermal dissipation and electrical conductivity in microcircuits, and reduce circuit board deflection when fabricated using anisotropic conductive adhesives.

An anisotropic conductive interface system for fabricating microcircuits consists primarily of an insulating carrier matrix in which conductive interconnect particles are suspended. The particles in the matrix, which is, for example, an organic or inorganic oil, forming a grease, or an electrically insulating curable polymer resin adhesive composition, when squeezed under pressure during microcircuit fabrication, interconnect the components and layers of the microcircuit chip or circuit board.

Figure 1A:
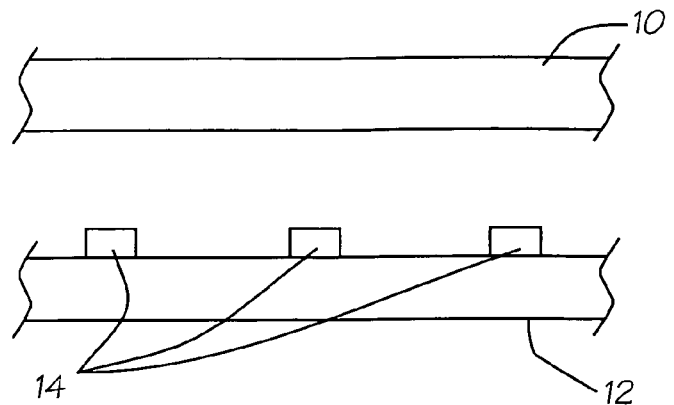
Figure 1B:
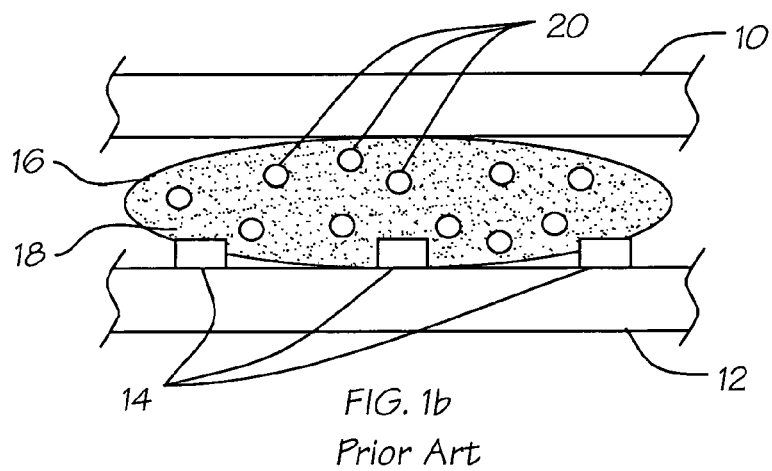
Figure 1C:
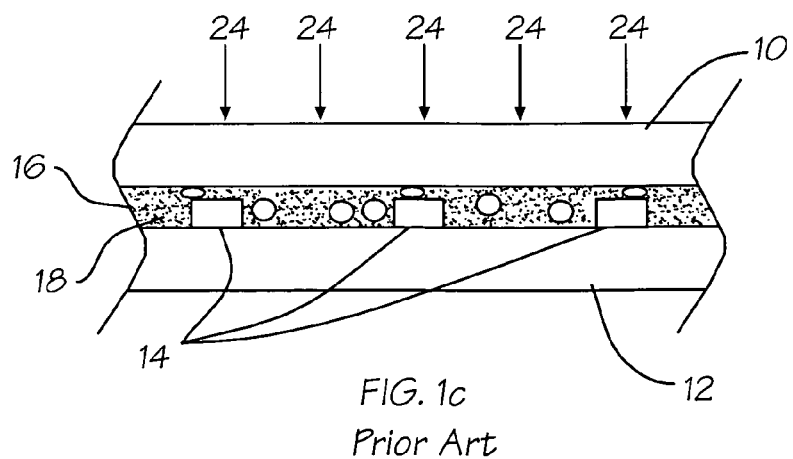

Referring to FIGS. 1a, 1b, and 1c, there are shown schematic drawings of typical microcircuit fabrication of the prior art. Assemblies of circuit fabrication are schematically represented in FIG. 1a by upper and lower circuit boards 10 and 12, respectively, which may be conductors, components, substrates, circuit boards, chips, or devices. Boards 10 and 12 have device connectors or printed circuits or thermal conductors 14 as shown on the lower board 12.

An anisotropic conductive composition 16 (FIG. 1b) is applied between the upper and lower boards 10, 12. The known anisotropic conductive composition 16 consists of a curable polymer resin carrier 18 filled with sufficient quantity of conductive interconnect particles 20, which are typically spherical.

Pressure (arrows 24) is applied to the upper and lower boards 10, 12 (FIG. 1c) forcing the anisotropic conductive composition 16 throughout the spaces on and between the boards 10, 12, and compressing the conductive interconnect particles 20 to make the interconnections between the boards 10, 12 and device connectors or printed circuits or thermal conductors 14.

Figure 2:
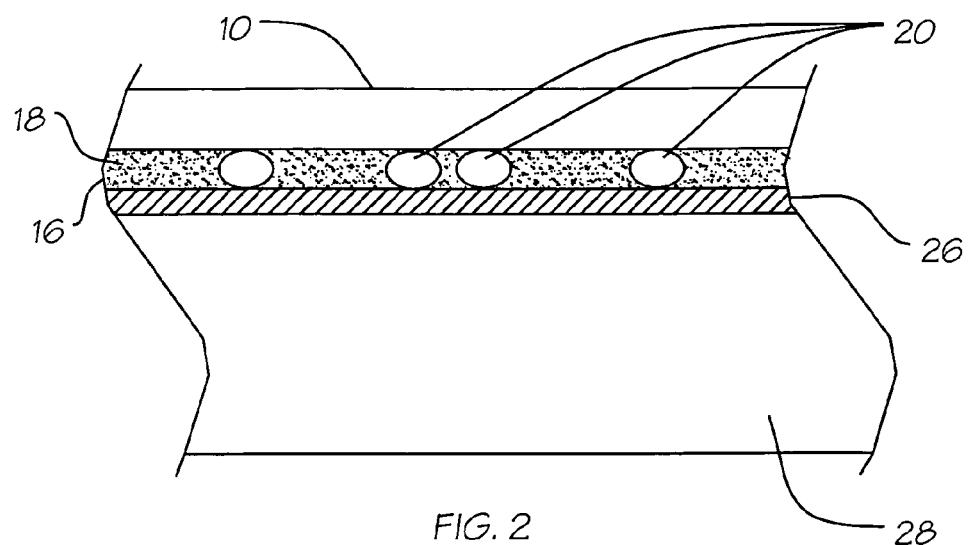
FIG. 2 is a schematic diagram of one example of prior art liquid crystal display (LCD) technology showing the compressed metallized polymer conductive sphere within the anisotropic conductive adhesive interconnecting the circuit conductor to the ITO metallization layer on the LCD glass.

Referring now to FIG. 2, there is shown a schematic diagram of a liquid crystal device (LCD), which is one specific type of microelectronic circuit using anisotropic conductive adhesive fabrication. The anisotropic conductive composition 16 with the carrier 18 and conductive interconnect particles 20 has been pressed so that conductor 25, an example of the upper assembly 10 (FIG. 1a), is interconnected to an indium-tin-oxide (ITO) metalized layer 26 on glass substrate 28, an example of the lower board 12 (FIG. 1a).

Figure 3:
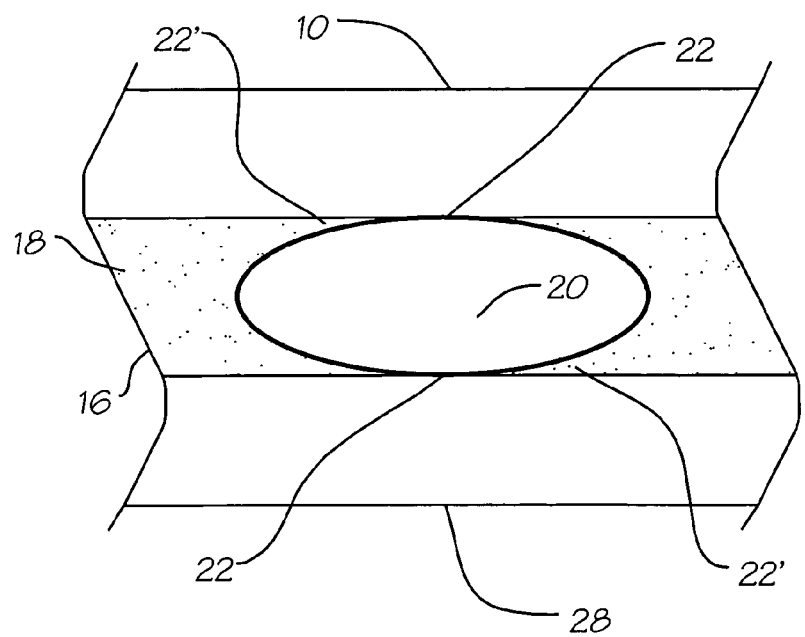
FIG. 3 is a schematic diagram depicting a prior art thermal interposer wherein a single smooth-walled particle contacts similarly smooth surfaces.

Referring now to FIG. 3, which is an enlarged view of FIG. 2 showing the contact between a single conductive interconnect particle 20, the device surface 10 and the board 28. Voids or pockets 22' of anisotropic conductive composition 16 or contaminants in those pockets 22', such as moisture, keep the heat transfer and electrical conductivity low between the device surface 10, device connectors or printed circuits or thermal conductors, not shown, and the interconnect spheres 20.

Figure 4A:
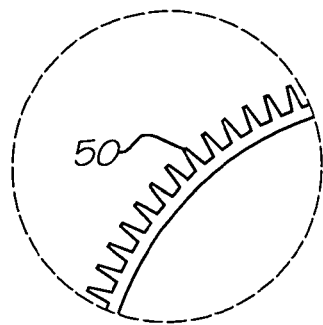
Figure 4B:
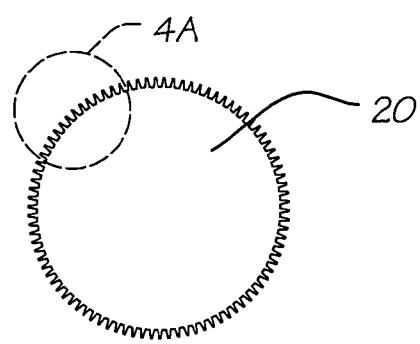
Figure 4C:
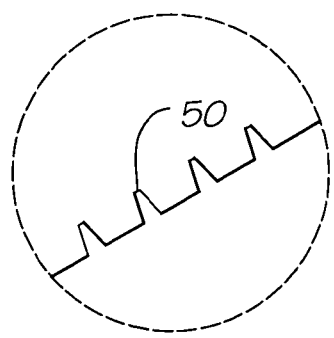
Figure 4D:
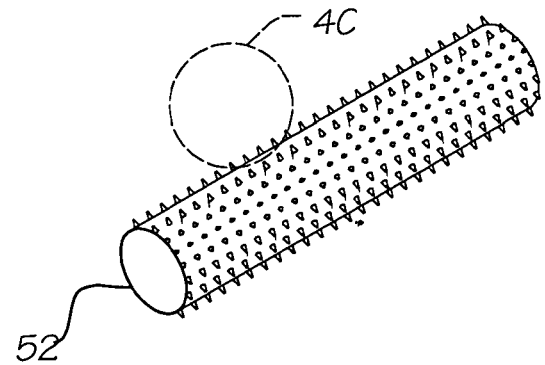

Referring now to FIGS. 4a, 4b, 4c and 4d, there are shown two of many shapes onto which nano-structures 50 are attached or grown. FIG. 4a shows an interconnect particle 20 with nanostructures 50, enlarged in FIG. 4a. FIG. 4d shows a thermally conductive tube 52 with nano-structures 50, enlarged in FIG. 4c.

It should be understood that interconnects and thermal conductors may be made in shapes other than spheres shown in FIG. 4b and tubes shown in FIG. 4d. Also, it should be understood that shapes other than the flat surfaces shown in diagrams for conductors and circuit boards can be used. And, further, shapes other than the columns shown may be used for the nano-structures. The nano-structures are preferably formed in such way that under mild compression, the nano-structures engage with each other and may interlock. For example, an elongated nano-structure may extend from a particle or surface, and on compression, engage the nano-structures of an adjacent particle or surface, and perhaps pierce its shell. The nano-structures preferably have an elongated axis which extends normal to the surface from which it extends, to fill less than 50% of the space in which they protrude, especially at the outermost reach of the nano-structures, to facilitate interaction of the nano-structure of adjacent particles or surfaces. Alternatively stated, the nano-structures preferably do not present a dense mat of structures. The nano-structures may have a higher hardness than the core of the conductive interconnect particles. The core, on the other hand, may be deformable, e.g., plastically deformable, when subject to pressure and/or piercing from the nano-structures.

Typically, the size range of fine particle interconnects and thermal conductors, represented here by a sphere 20 and a tube 52, are 1 to 20 microns in diameter.

The nano-structures 50 attached to or grown from the surfaces of conductive interconnect particles 20 and thermal conductor tubes 52, for example, are 1 to 200 nanometers in length. The materials the nano-structures can be made from include: carbon, metal, polymers, metallized polymers, electrical and thermal conducting materials, and the like; the shapes of these nano-structure include columns, spikes, cylinders, tubes, hemispheres, fibers, regular, and irregular or inhomogeneous shapes.

Referring now to FIG. 5, there is shown a schematic diagram of a fabricated circuit with the inventive nano-structures 50 attached to or grown from conductive interconnect particles 20 or thermal conductor tubes 52, and inventive nano-structures 50 attached to or grown from boards 10, 12. Anisotropic conductive composition 16, which in this case can be an adhesive, curable matrix, liquid or gel, is disposed throughout the spaces between the boards 10, 12. The invention improves the prior art by adding nano-structures 50 to the conductive interconnect particles 20, and the surfaces of boards 10, 12, which mesh and compress into a more uniform connection 22", thereby eliminating voids, moisture and other contaminants 22" increasing the contact surfaces 22" for better electrical and thermal conduction.

As the number of nano-structures 50 attached to or grown on the surfaces of boards 10, 12, conductive interconnect particles 20, and thermal conductor tubes 52 are increased by making them uniform and consistently spaced, the thermal conduction and electrical connection are improved.

Additionally, because the interconnect contact surface 22" is increased with the meshing of the nano-structures, improved contact can be achieved with lower pressure (arrows 24, FIG. 1c) applied to the circuit components and circuit boards 10, 12, and connections 14 (FIG. 1a) than is required by conventional techniques. Lower pressure results in reduced distortion and likelihood of damage of the circuit boards 10, 12 and connections 14.

Referring now to FIGS. 6a, 6b, and 6c, there are shown schematic diagrams depicting one specific type of fabricated circuit, assembly of a chip 62 to a heat sink 64, with a thermal plane 60, shown for the purpose of example. Nano-structures 50 are attached to or grown from a thermal plane interface 60 and circuit chip 62 and heat sink 64.

Thermal planes 60 may be made of rigid or flexible metal, metallized soft substrate, or any other high thermal conductivity material. Thermal plane shapes may be corrugated waves as shown or any other regular or irregular shape that fits the needs of the circuit fabrication.

Assemblies of circuit fabrication are schematically represented in FIG. 6b by thermal plane interface 60 and circuit chip 62 and heat sink 64.

In FIG. 6c, pressure (arrows 24) is applied to the circuit chip 62 and heat sink 64 to make the interconnections between the thermal plane interface 60 and circuit chip 62 and heat sink 64.

In operation, the nano-structures 50 may be attached to or grown from the surfaces of the spheres 20, electrical and thermal conductors, device connectors 14, and other surfaces of circuit assemblies by sputtering, dissolving in highly volatile solution and spray coat sol-gel, fluidized bed, epitaxial growth, chemical vapor deposition (CVD), precipitations, or any other process that befits the needs of the circuit fabrication.

Referring now to FIGS. 6d and 6e, there are shown schematic diagrams depicting an assembly of a heat sink 64 and a circuit element 62 nano-structures 50 grown on filler material particles 80 or heat sink 64 to improve their contact within the anisotropic adhesive system. In contrast to the arrangement of FIGS. 5, 6a, 6b, and 6c, in this arrangement, the filler particles are much smaller than the gap 82 between the package elements 62 and 64, and therefore, they will cluster together in the wall layer 84 and core layer 86, and a thermal path requires several particles 80 to bridge the gap 82.

Therefore, in this embodiment, the loading of particles is intentionally maintained below a level which would lead isotropic conductivity, but sufficient to ensure conduction under compression. It is noted that the matrix is present in a liquid or gel form during compression, and the nano-structures preferably engage each other to reduce slippage and transport of particles after contact while pressure is applied, while the matrix material is more free to flow between chains of particles. Therefore, under compression of the uncured or liquid matrix, there is preferably a relative selective concentration effect on of the conductive interconnect particles between the narrower gaps where conductive pads are present, and a selective dilution effect of the conductive interconnect particles in the intercontact spaces.

In the embodiments of FIGS. 1-6c, the anisotropic conductive composition is sought to be squeezed at high pressure to a layer thickness corresponding to a particle. The thermal conductivity is perhaps enhanced by the thin target interface layer, but the loading density of conductive particles (which provide substantial thermal conductivity) is limited in these applications by the need for suitable viscosity to permit forming a thin uniform layer without voids, and the need to avoid clumping of particles and loss of anisotropicity.

In FIG. 6d, nano-structures 50 are attached to or grown from heat sink 64, and in FIG. 6e, nano-structures 50 are attached to or grown from filler material particles 82.

Alternate embodiments of the present invention may be implemented with nano-structures appended to or grown from the surface of any contact surface, such as a flexible card with bowed circuit lands, where the meshing of the nano-structures maintains better contact between the interconnect spheres, thermal tubes, circuit conductors, and components.

Since other modifications and changes varied to fit particular operating requirements and environments will be apparent to those skilled in the art, the invention is not considered limited to the example chosen for purposes of disclosure, and covers changes and modifications which do not constitute departures from the true spirit and scope of this invention.

Having thus described the invention, what is desired to be protected by Letters Patent is presented in the subsequently appended claims.

What is claimed is:

1. A module, comprising:
an anisotropic conductive composition, comprising:
   a electrically insulating carrier composition;
   a plurality of electrically and thermally conductive interconnect particles suspended in the electrically insulating carrier composition, each having an outer surface, wherein said conductive interconnect particles comprise at least one particle selected from the group consisting of ovoid, disk-like, and tubular particles; and
   a plurality of electrically conducting elongated nanostructures affixed to and selectively extending away from the outer surface along the elongated axis,
   wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition, and
   wherein the conducting elongated nanostructures on a respective conductive interconnect particle are adapted to engage and interlock with the conducting elongated nanostructures on another respective conductive interconnect particle when mutually compressed, to form an efficient thermal and electrical conduction path;
at least two pairs of opposed contact surfaces, having an intracontact gap between the contact surfaces of a respective pair and an intercontact gap between respective pairs, having a compressed continuous film of the anisotropic conductive composition disposed between the at least two pairs of opposed contact surfaces; and
a plurality of electrically isolated conductive paths formed across the intracontact gaps each respective path comprising engaged and interlocked conducting elongated nanostructures, which are mutually isolated by a selectively occurring electrically isolating space in the intercontact gap in which interlocked conducting elongated nanostructures bridging the intercontact gap are substantially absent.

2. The module in accordance with claim 1, wherein said insulating carrier composition comprises an adhesive polymer resin.

3. The module in accordance with claim 1, wherein said insulating carrier composition comprises an organic or inorganic oil.

4. The module in accordance with claim 1, wherein said conductive interconnect particles have a metallic shell comprising the conducting elongated nanostructures.

5. The module in accordance with claim 1, wherein said conductive interconnect particles comprise ovoid particles.

6. The module in accordance with claim 1, wherein said conductive interconnect particles comprise disk-like particles.

7. The module in accordance with claim 1, wherein said conductive interconnect particles comprise tubular particles.

8. The module in accordance with claim 1, wherein said nanostructures are selected from the group consisting of one or more of columns, spikes, cylinders, tubes and fibers.

9. The module in accordance with claim 1, wherein the compressed continuous film of the anisotropic conductive composition disposed between the at least two pairs of opposed contact surfaces comprises a cured adhesive resin, and wherein the at least two pairs of opposed contact surfaces are maintained in relative position by at least the cured adhesive resin.

10. The module to claim 9, wherein at least one contact surface is coated with a plurality of electrically conducting elongated nanostructures affixed to and selectively extending away from the contact surface along the elongated axis, wherein the conducting elongated nanostructures on the contact surface are adapted to engage and interlock with the conducting elongated nanostructures on an adjacent conductive interconnect particle when mutually compressed, to form an efficient thermal and electrical conduction path.

11. A method of forming an anisotropic conductive path of a module, comprising:
   providing an anisotropic conductive composition, comprising a plurality of aspheric electrically and thermally conductive interconnect particles suspended in a viscous electrically insulating carrier composition, each having an outer surface, with a plurality of electrically conducting elongated nanostructures affixed to and selectively extending away from the outer surface along the elongated axis, wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition;
   dispensing the anisotropic conductive composition between at least two pairs of opposed contact surfaces, having an intracontact gap between the contact surfaces of a respective pair and an intercontact gap between respective pairs; and
   compressing the anisotropic conductive composition to selectively form electrical conduction paths across the opposed contact surfaces maintaining electrical isolation between non-opposed contact surfaces, wherein the conducting elongated nanostructures on a respective conductive interconnect particle are adapted to engage and interlock with the conducting elongated nanostructures on another respective conductive interconnect particle when mutually compressed, to form an efficient thermal and electrical conduction path.

12. The method according to claim 11, wherein said insulating carrier composition comprises an adhesive polymer resin, further comprising hardening the adhesive polymer resin.

13. The method according to claim 11, wherein said insulating carrier composition comprises a thermal grease.

14. The method according to claim 11, wherein said conductive interconnect particles have a shape selected from the group consisting of one or more of spherical, ovoid, disk-like, and tubular.

15. The method according to claim 11, wherein said nanostructures are selected from the group consisting of one or more of columns, spikes, cylinders, tubes and fibers.

16. The method according to claim 11, wherein at least one contact surface is coated with a plurality of electrically conducting elongated nanostructures affixed to and selectively extending away from the contact surface along the elongated axis, further comprising mutually compress the conducting elongated nanostructures on the contact surface to engage and interlock with the conducting elongated nanostructures on an adjacent conductive interconnect particle, to form an efficient thermal and electrical conduction path.

17. A module, comprising:
   at least two pairs of opposed contact surfaces, having an intracontact gap between the contact surfaces of a respective pair and an intercontact gap between respective pairs;
   a continuous portion of an anisotropic conductive composition provided in the intracontact gap and the intercontact gap, comprising a plurality of electrically and thermally conductive interconnect particles suspended in an electrically insulating carrier composition, each having an outer surface, with a plurality of electrically conducting elongated nanostructures affixed to and selectively extending away from the outer surface along the elongated axis, wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition, and comprise a carbonaceous or organic polymer core, and the nanostructures extend from a metallic coating on the core; and
   a selectively formed electrically conductive path across the intracontact gaps comprising engaged and interlocked conducting elongated nanostructures, and a selectively formed electrically isolating space in the intercontact gap between respective pairs of opposed contact surfaces, in which the engaged and interlocked conducting elongated nanostructures bridging the intercontact gap provide lower electrical conductivity than across the intracontact gaps.

18. The module according to claim 17, wherein the electrically insulating carrier composition comprises one of a curable adhesive resin and an oil.

19. A module, comprising:
   at least two pairs of opposed contact surfaces, having an intracontact gap between the contact surfaces of a respective pair and an intercontact gap between respective pairs;
   a continuous portion of an anisotropic conductive composition provided in the intracontact gap and the intercontact gap, comprising a plurality of electrically and thermally conductive interconnect particles suspended in an electrically insulating carrier composition comprising an oil, each having an outer surface, with a plurality of electrically conducting elongated nanostructures affixed to and selectively extending away from the outer surface along the elongated axis, wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition; and a selectively formed electrically conductive path across the intracontact gaps comprising engaged and interlocked conducting elongated nanostructures, and a selectively formed electrically isolating space in the intercontact gap between respective pairs of opposed contact surfaces, in which the engaged and interlocked conducting elongated nanostructures bridging the intercontact gap provide lower electrical conductivity than across the intracontact gaps.

20. A module, comprising:

an anisotropic conductive composition, comprising:

a electrically insulating carrier composition comprising an organic or inorganic oil;

a plurality of electrically and thermally conductive interconnect particles suspended in the electrically insulating carrier composition, each having an outer surface; and a plurality of electrically conducting elongated nanostructures affixed to and selectively extending away from the outer surface along the elongated axis, wherein the plurality of conductive interconnect particles are provided within a range of concentration sufficient to provide a substantially anisotropic electrical conduction pattern aligned with the compression axis and a high probability of interacting with each other, under compression of a film of the anisotropic conductive composition, and wherein the conducting elongated nanostructures on a respective conductive interconnect particle are adapted to engage and interlock with the conducting elongated nanostructures on another respective conductive interconnect particle when mutually compressed, to form an efficient thermal and electrical conduction path;

at least two pairs of opposed contact surfaces, having an intracontact gap between the contact surfaces of a respective pair and an intercontact gap between respective pairs, having a compressed continuous film of the anisotropic conductive composition disposed between the at least two pairs of opposed contact surfaces; and a plurality of electrically isolated conductive paths formed across the intracontact gaps each respective path comprising engaged and interlocked conducting elongated nanostructures, which are mutually isolated by a selectively occurring electrically isolating space in the intercontact gap in which interlocked conducting elongated nanostructures bridging the intercontact gap are substantially absent.

* * * * *